(12) United States Patent
Seo et al.

(10) Patent No.: US 12,457,862 B2
(45) Date of Patent: Oct. 28, 2025

(54) DISPLAY DEVICE AND METHOD FOR MANUFACTURING THE SAME

(71) Applicant: Samsung Display Co., LTD., Yongin-si (KR)

(72) Inventors: Jong Oh Seo, Yongin-si (KR); Dong-Min Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 424 days.

(21) Appl. No.: 18/117,023

(22) Filed: Mar. 3, 2023

(65) Prior Publication Data

US 2024/0008319 A1  Jan. 4, 2024

(30) Foreign Application Priority Data

Jul. 1, 2022  (KR) .................. 10-2022-0081268

(51) Int. Cl.
*H10K 59/124* (2023.01)
*H10D 30/01* (2025.01)
*H10D 30/67* (2025.01)
*H10K 59/12* (2023.01)
(Continued)

(52) U.S. Cl.
CPC .......... *H10K 59/124* (2023.02); *H10D 30/031* (2025.01); *H10D 30/6729* (2025.01); *H10D 30/673* (2025.01); *H10D 30/6757* (2025.01); *H10K 59/1201* (2023.02); *H10K 71/80* (2023.02); *H10K 77/111* (2023.02)

(58) Field of Classification Search
CPC .. H10K 59/124; H10K 59/1201; H10K 71/80; H10K 77/111; H10K 59/1213; H10K 2102/311; H10K 59/123; H10K 71/00; H10D 30/031; H10D 30/6729; H10D 30/673; H10D 30/6757; H10D 86/0214; H10D 86/411; H10D 86/421; H10D 86/60; H10D 86/441; H10D 86/0221; H10D 86/451
See application file for complete search history.

(56) References Cited

U.S. PATENT DOCUMENTS

| | | | |
|---|---|---|---|
| 8,519,612 B2 | 8/2013 | Yoon et al. | |
| 2021/0098582 A1* | 4/2021 | Yan | ........................ H01L 23/485 |
| 2021/0202530 A1* | 7/2021 | Yao | ..................... H10K 59/1213 |

FOREIGN PATENT DOCUMENTS

| | | |
|---|---|---|
| JP | 2009-54539 | 3/2009 |
| KR | 10-0347826 | 11/2002 |
| KR | 10-2006-0080827 | 7/2006 |

(Continued)

OTHER PUBLICATIONS

Korean International Search Report for International Application No. PCT/KR2023/009250, dated Oct. 4, 2023.

*Primary Examiner* — J. E. Schoenholtz
(74) *Attorney, Agent, or Firm* — Harness, Dickey & Pierce, P.L.C.

(57) ABSTRACT

A display device includes a substrate including an opening, a buffer layer disposed on the substrate, a semiconductor disposed on the buffer layer, a gate electrode overlapping at least a portion of the semiconductor in a plan view, a source electrode and a drain electrode electrically connected to the semiconductor, and a light-emitting device electrically connected to the drain electrode. The opening of the substrate overlaps another portion of the semiconductor in a plan view.

20 Claims, 20 Drawing Sheets

(51) Int. Cl.
    *H10K 71/80*     (2023.01)
    *H10K 77/10*     (2023.01)

(56) References Cited

FOREIGN PATENT DOCUMENTS

| | | |
|---|---|---|
| KR | 10-1125566 | 3/2012 |
| KR | 10-2014-0027880 | 3/2014 |
| KR | 10-2017-0113798 | 10/2017 |
| KR | 10-2018-0052056 | 5/2018 |
| KR | 10-2019-0079248 | 7/2019 |
| KR | 10-2034071 | 10/2019 |
| KR | 10-2021-0137418 | 11/2021 |

* cited by examiner

DISPLAY DEVICE AND METHOD FOR MANUFACTURING THE SAME

CROSS-REFERENCE TO RELATED APPLICATION(S)

This application claims priority to and the benefits of Korean Patent Application No. 10-2022-0081268 under 35 U.S.C. § 119, filed in the Korean Intellectual Property Office (KIPO), on Jul. 1, 2022, the entire contents of which are incorporated herein by reference.

BACKGROUND

1. Technical Field

The disclosure relates to a display device and a method for manufacturing the same.

2. Description of the Related Art

A variety of electronic devices employing a liquid crystal display (LCD) or an organic light emitting diode (OLED) display as a display device, such as cellular phones, navigation systems, digital cameras, e-book readers, portable game devices, and various terminals, have been used.

Recently, such a display device has been developed to have a flexible property. For example, a foldable display device, a bendable display device, and a stretchable display device have been under development.

The flexible display device may include a flexible substrate. As the flexible substrate is made of a flexible substance, it may not be easy to form elements on the flexible substrate. Hence, the flexible substrate is formed on a supporting substrate, elements are formed thereon, and the supporting substrate may be separated from the flexible substrate.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a display device for improving characteristics of elements included in a flexible display device, and a method for manufacturing the same.

According to an embodiment, a display device may include a substrate including an opening, a buffer layer disposed on the substrate, a semiconductor disposed on the buffer layer, a gate electrode overlapping at least a portion of the semiconductor in a plan view, a source electrode and a drain electrode electrically connected to the semiconductor, and a light-emitting device electrically connected to the drain electrode. The opening of the substrate may overlap another portion of the semiconductor in a plan view.

The semiconductor may include a channel region overlapping the gate electrode in a plan view, a first region disposed on a side of the channel region, a second region disposed on another side of the channel region, a first contact region disposed in the first region, and a second contact region disposed in the second region.

The opening of the substrate may include a first opening and a second opening. The first opening of the substrate may overlap the first contact region in a plan view, and the second opening of the substrate may overlap the second contact region in a plan view.

The source electrode may electrically contact an upper surface of the first contact region, and the drain electrode may electrically contact an upper surface of the second contact region.

A width of the first opening of the substrate and a width of the first contact region in a cross-sectional view may be same, and a width of the second opening of the substrate and a width of the second contact region in a cross-sectional view may be same.

A resistance of the first contact region may be lower than a resistance of the first region, and a resistance of the second contact region may be lower than a resistance of the second region.

The display device may further include an interlayer insulating layer disposed between the semiconductor and the source electrode and between the semiconductor and the drain electrode. The interlayer insulating layer may include a first opening overlapping the semiconductor and the source electrode in a plan view, and a second opening overlapping the semiconductor and the drain electrode in a plan view. The source electrode may be electrically connected to the semiconductor through the first opening of the interlayer insulating layer, and the drain electrode may be electrically connected to the semiconductor through the second opening of the interlayer insulating layer.

The first opening and the second opening of the interlayer insulating layer may overlap the opening of the substrate in a plan view.

The substrate may include a flexible material.

The buffer layer may fill the opening of the substrate.

According to an embodiment, a method for manufacturing a display device may include forming a substrate on a supporting substrate, forming an opening in the substrate by patterning the substrate, forming a buffer layer on the substrate, forming a semiconductor overlapping the opening of the substrate in a plan view on the buffer layer, forming a gate electrode overlapping the semiconductor in a plan view, forming a source electrode and a drain electrode electrically connected to the semiconductor, forming a light-emitting device electrically connected to the drain electrode, and separating the supporting substrate from the substrate by irradiating laser beams to lower surface of the supporting substrate.

The semiconductor may include a channel region overlapping the gate electrode in a plan view, a first region disposed on a side of the channel region, a second region disposed on another side of the channel region, a first contact region disposed in the first region, and a second contact region disposed in the second region.

The opening of the substrate may include a first opening and a second opening. The first opening of the substrate may overlap the first contact region in a plan view, the second opening of the substrate may overlap the second contact region in a plan view, and the laser beams irradiated in the irradiating of the laser beams may pass through the first opening and the second opening of the substrate and may reach the first contact region and the second contact region.

The source electrode may electrically contact an upper surface of the first contact region, and the drain electrode may electrically contact an upper surface of the second contact region.

A width of the first opening of the substrate and a width of the first contact region in a cross-sectional view may be same, and a width of the opening of the substrate and a width of the second contact region in a cross-sectional view may be same.

A resistance of the first contact region may be lower than a resistance of the first region, and a resistance of the second contact region may be lower than a resistance of the second region.

The method may further include, after the forming of the gate electrode, forming an interlayer insulating layer on the gate electrode, and forming a first opening and a second opening on the interlayer insulating layer. The source electrode and the drain electrode may be disposed on the interlayer insulating layer, the first opening of the interlayer insulating layer may overlap the semiconductor and the source electrode in a plan view, the second opening of the interlayer insulating layer may overlap the semiconductor and the drain electrode in a plan view, the source electrode may be electrically connected to the semiconductor through the first opening of the interlayer insulating layer, and the drain electrode may be electrically connected to the semiconductor through the second opening of the interlayer insulating layer.

The first opening and the second opening of the interlayer insulating layer may overlap the opening of the substrate in a plan view.

The supporting substrate may include a rigid material, and the substrate may include a flexible material.

The forming of a buffer layer may include filling the buffer layer in the opening of the substrate.

According to the embodiments, the characteristics of the elements included in the flexible display device may be improved.

DETAILED DESCRIPTION OF THE EMBODIMENTS

Figure 1:
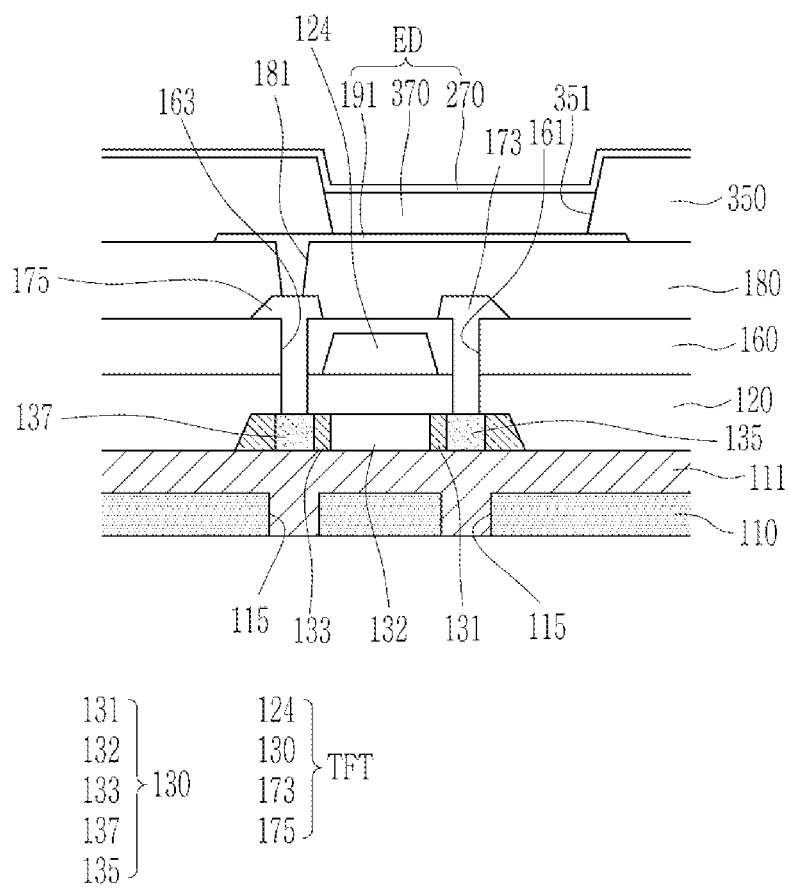
FIG. 1 shows a schematic cross-sectional view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Parts that are irrelevant to the description will be omitted to clearly describe the embodiments, and the same elements will be designated by the same reference numerals throughout the specification.

In the drawings, the thickness of layers, films, panels, regions, etc., are enlarged for clarity. The thicknesses of some layers and areas are exaggerated.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless explicitly described to the contrary, the word "comprise", and variations such as "comprises" or "comprising", will be understood to imply the inclusion of stated elements but not the exclusion of any other elements.

The phrase "in a plan view" means viewing a target portion from the top, and the phrase "in a cross-sectional view" means viewing a cross-section formed by perpendicularly cutting a target portion from the side.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A display device according to an embodiment will now be described with reference to FIG. 1.

FIG. 1 shows a schematic cross-sectional view of a display device according to an embodiment.

As shown in FIG. 1, the display device may include a substrate 110, a transistor TFT positioned on the substrate 110, and a light-emitting device ED connected to the transistor TFT.

The substrate 110 may be a flexible substrate that may be bent, folded, or rolled. For example, the substrate 110 may include a material such as polystyrene, polyvinyl alcohol, polymethylmethacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. The substrate 110 may include a single layer or a multilayer. The substrate 110 may be formed by alternately stacking at least one base layer including sequentially stacked polymer resins and at least one organic layer each other.

The substrate 110 may include an opening 115. The opening 115 may penetrate the substrate 110. The opening 115 may overlap the transistor TFT in a plan view. The opening 115 may overlap a region of the semiconductor 130 of the transistor TFT.

A buffer layer 111 for flattening a surface of the substrate 110 and blocking permeation of impurities may be positioned on the substrate 110. The buffer layer 111 may be also positioned in the opening 115 of the substrate 110. The buffer layer 111 may be formed to fill the opening 115 of the substrate 110, and an upper side of the buffer layer 111 may be made planar.

The buffer layer 111 may include an inorganic insulating material such as a silicon nitride ($SiN_x$), a silicon oxide ($SiO_x$), or a silicon oxynitride ($SiO_xN_y$) or an organic insulating material. The buffer layer 111 may have a single or multi-layered structure. A barrier layer (not shown) may be positioned on the substrate 110. The barrier layer may be positioned between the substrate 110 and the buffer layer 111. The barrier layer may include an inorganic insulating material such as a silicon nitride ($SiN_x$), a silicon oxide ($SiO_x$), or a silicon oxynitride ($SiO_xN_y$). The barrier layer may have a single or multi-layered structure.

A semiconductor 130 may be positioned on the buffer layer 111. The semiconductor 130 may include at least one of amorphous silicon, polycrystalline silicon, and an oxide semiconductor. For example, the semiconductor 130 may include low temperature polysilicon (LTPS), or may include an oxide semiconductor material including at least one of zinc (Zn), indium (In), gallium (Ga), tin (Sn), and a mixture thereof. For example, the semiconductor 130 may include IGZO (Indium-Gallium-Zinc Oxide). The semiconductor 130 may include a first region 131, a channel region 132, and a second region 133 divided by doping of impurities. The first region 131 and the second region 133 may be positioned on respective sides of the channel region 132 of the semiconductor 130. The first region 131 and the second region 133 may have conductive characteristics corresponding to a conductor.

The semiconductor 130 may further include a first contact region 135 positioned in the first region 131 and a second contact region 137 positioned in the second region 133. The first region 131 may be positioned on a side of the first contact region 135. For example, the first contact region 135 may be surrounded by the first region 131. However, the disclosure is not limited thereto, and the position of the first contact region 135 may be changed. For example, the first contact region 135 may be positioned between the channel region 132 and the first region 131. The second region 133 may be positioned on another side of the second contact region 137. For example, the second contact region 137 may be surrounded by the second region 133. However, the disclosure is not limited thereto, and the position of the second contact region 137 may be changed. For example, the second contact region 137 may be positioned between the channel region 132 and the second region 133.

The first contact region 135 and the second contact region 137 may overlap the opening 115 of the substrate 110 in a plan view. The opening 115 of the substrate 110 may be positioned under the first contact region 135, and may be positioned under the second contact region 137.

The first contact region 135 may overlap the opening 115 in a direction that is perpendicular to an upper side of the substrate 110. A thickness of the first contact region 135 may be similar to a thickness of the first region 131. For example, the thickness of the first contact region 135 and the thickness of the first region 131 may be substantially the same. However, without being limited thereto, the thickness of the first contact region 135 may be less than the thickness of the first region 131. A width of the first contact region 135 may correspond to a width of a portion of the opening 115 overlapping the first contact region 135. For example, the width of the first contact region 135 and the width of the portion of the opening 115 overlapping the first contact region 135 may be substantially the same. However, without being limited thereto, the width of the first contact region 135 may be greater or less than the width of the portion of the opening 115 overlapping the first contact region 135.

The second contact region 137 may overlap the opening 115 in the direction that is perpendicular to the upper side of the substrate 110. The thickness of the second contact region 137 may be similar to the thickness of the second region 133. For example, the thickness of the second contact region 137 and the thickness of the second region 133 may be substantially the same. However, without being limited thereto, the thickness of the second contact region 137 may be less than the thickness of the second region 133. The width of the second contact region 137 may correspond to the width of the portion of the opening 115 overlapping the second contact region 137. For example, the width of the second contact region 137 and the width of the portion of the opening 115 overlapping the second contact region 137 may be substantially the same. However, without being limited thereto, the width of the second contact region 137 may be greater or less than the width of the portion of the opening 115 overlapping the second contact region 137.

The first contact region 135 and the second contact region 137 may have a conductive characteristic corresponding to the conductor similar to the first region 131 and the second region 133. The conductive characteristics of the first contact region 135 and the second contact region 137 may be different from the conductive characteristics of the first region 131 and the second region 133. For example, resistances of the first contact region 135 and the second contact region 137 may be lower than resistances of the first region 131 and the second region 133.

A gate insulating layer 120 may be positioned on the semiconductor 130. The gate insulating layer 120 may cover the semiconductor 130 and the buffer layer 111. The gate insulating layer 120 may include an inorganic insulating material such as a silicon nitride ($SiN_x$), a silicon oxide ($SiO_x$), or a silicon oxynitride ($SiO_xN_y$). The gate insulating layer 120 may have a single or multi-layered structure.

A gate electrode 124 may be positioned on the gate insulating layer 120. The gate electrode 124 may overlap at least a part of the semiconductor 130 in a plan view. The gate electrode 124 may include a metal such as copper (Cu), molybdenum (Mo), aluminum (Al), silver (Ag), chromium (Cr), tantalum (Ta), or titanium (Ti), or a metal alloy thereof. The gate electrode 124 may have a single or multilayered structure. For example, the gate electrode 124 may be made of double layers, and may include a layer including aluminum (Al) and a layer including titanium (Ti).

After the gate electrode 124 is formed, a doping process or a plasma process may be performed. The portion of the semiconductor 130 overlapping the gate electrode 124 in a plan view may not be doped or plasma-processed, and the portion of the semiconductor 130 not overlapping the gate electrode 124 in a plan view may be doped or plasma-processed and may have a characteristic of a conductor. A region of the semiconductor 130 overlapping the gate electrode 124 in a plan view may be the channel region 132. The first region 131, the second region 133, the first contact region 135, and the second contact region 137 of the semiconductor 130 may not overlap the gate electrode 124. The gate electrode 124 may not overlap the opening 115 of the substrate 110. The channel region 132 of the semiconductor 130 may not overlap the opening 115 of the substrate 110.

An interlayer insulating layer 160 may be positioned on the gate electrode 124. The interlayer insulating layer 160 may cover the gate electrode 124 and the gate insulating layer 120. The interlayer insulating layer 160 may include an inorganic insulating material such as a silicon nitride ($SiN_x$), a silicon oxide ($SiO_x$), or a silicon oxynitride ($SiO_xN_y$). The interlayer insulating layer 160 may have a single or multi-layered structure.

A source electrode 173 and a drain electrode 175 may be positioned on the interlayer insulating layer 160. An opening 161 overlapping the source electrode 173 and the semiconductor 130 may be formed in the interlayer insulating layer 160 and the gate insulating layer 120. The opening 161 may overlap the first contact region 135 of the semiconductor 130. The source electrode 173 may be connected to the first contact region 135 of the semiconductor 130 through the opening 161. The source electrode 173 may contact the upper side of the first contact region 135. An opening 163 overlapping the drain electrode 175 and the semiconductor 130 may be formed in the interlayer insulating layer 160 and the gate insulating layer 120. The opening 163 may overlap the second contact region 137 of the semiconductor 130. The drain electrode 175 may be connected to the second contact region 137 of the semiconductor 130 through the opening 163. The drain electrode 175 may contact the upper side of the second contact region 137.

The openings 161 and 163 of the interlayer insulating layer 160 may overlap the opening 115 of the substrate 110. Therefore, the portion in which the source electrode 173 contacts the semiconductor 130 may overlap the opening 115 of the substrate 110. The portion in which the drain electrode 175 contacts the semiconductor 130 may overlap the opening 115 of the substrate 110.

The semiconductor 130, the gate electrode 124, the source electrode 173, and the drain electrode 175 may configure one transistor TFT. Depending on embodiments, the transistor TFT may not include the source electrode 173 and the drain electrode 175 but may include the first region 131 and the second region 133 of the semiconductor 130. FIG. 1 shows one transistor TFT, and the display device according to an embodiment may include multiple pixels, and the respective pixels may include multiple transistors TFT.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The source electrode 173 and the drain electrode 175 may respectively have a single or multi-layered structure. For example, the source electrode 173 and the drain electrode 175 may have a triple-layered structure of: a lower film containing a refractory metal such as molybdenum, chromium, tantalum, and titanium, or an alloy thereof; an intermediate film containing an aluminum-based metal, a silver-based metal, and/or a copper-based metal that has low resistivity; and an upper film containing a refractory metal such as molybdenum, chromium, tantalum, and titanium.

A passivation layer 180 may be positioned on the source electrode 173 and the drain electrode 175. The passivation layer 180 may cover the source electrode 173, the drain electrode 175, and the interlayer insulating layer 160. The passivation layer 180 may planarize the surface of the substrate 110 on which the transistors TFT are mounted, and may be an organic insulator. The passivation layer 180 may include an organic insulating material such as a general-purpose polymer such as poly(methyl methacrylate) (PMMA) or polystyrene (PS), a polymer derivative having a phenol-based group, an acryl-based polymer, an imide-based polymer, a polyimide, an acryl-based polymer, and a siloxane-based polymer.

A light-emitting device ED may be positioned on the passivation layer 180. The light-emitting device ED may be connected to the transistor TFT. The light-emitting device ED may include a first electrode 191, an emission layer 370, and a second electrode 270.

The first electrode 191 may be positioned on the passivation layer 180. The first electrode 191 may be an anode, and may be configured with a single layer including a transparent conductive oxide or a metal, or a multilayer including them. The transparent conductive oxide may include indium tin oxide (ITO), poly-ITO, indium zinc oxide (IZO), indium gallium zinc oxide (IGZO), and/or indium tin zinc oxide (ITZO). The metal may include silver (Ag), molybdenum (Mo), copper (Cu), gold (Au), and/or aluminum (Al). For example, the first electrode 191 may include a lower layer, an intermediate layer, and an upper layer. The lower layer of the first electrode 191 may be positioned on the passivation layer 180, the intermediate layer may be positioned on the lower layer, and the upper layer may be positioned on the intermediate layer. The intermediate layer of the first electrode 191 may be made of a material that is different from a material of the lower layer and the upper layer. For example, the intermediate layer may be made of silver (Ag), and the lower layer and the upper layer may be made of an ITO.

The passivation layer 180 may include an opening 181 overlapping the first electrode 191 and the drain electrode 175 in a plan view. The first electrode 191 may be connected to the drain electrode 175 through the opening 181. Therefore, the first electrode 191 may be connected to the transistor TFT.

A partition wall or a bank 350 may be positioned on the first electrode 191. The bank 350 may be a pixel defining layer (PDL), and may include a pixel opening 351 overlapping at least a part of the first electrode 191. The pixel opening 351 may overlap a center portion of the first electrode 191, and may not overlap an edge portion of the first electrode 191. Hence, an area of the pixel opening 351 may be less than an area of the first electrode 191 in a plan view. The bank 350 may be an organic insulator including at least one material selected from the group of polyimide, polyamide, an acryl resin, benzocyclobutene, and a phenol resin. In another embodiment, the bank 350 may include an inorganic insulating material such as a silicon nitride ($SiN_x$), a silicon oxide ($SiO_x$), or a silicon oxynitride ($SiO_xN_y$). In another embodiment, the bank 350 may be made of a black pixel defining layer BPDL including a light blocking material. The light blocking material may include a resin or a paste including carbon black, carbon nanotubes, a black dye, metal particles, for example, nickel, aluminum, molybdenum, and an alloy thereof, metal oxide particles (e.g., a chromium oxide), or metal nitride particles (e.g., a chromium nitride). In case that the bank 350 includes the light blocking material, reflection of external light by metallic structures disposed on a lower side of the bank 350 may be reduced. However, without being limited thereto, the bank 350 may not include the light blocking material and may include a transmissive organic insulating material.

An emission layer 370 may be positioned in the pixel opening 351 of the bank 350. The emission layer 370 may overlap the first electrode 191. The emission layer 370 may include an organic material for emitting light such as red, green, and blue. The emission layer 370 may include a low-molecule or high-molecule organic material. The emission layer 370 is illustrated as a single layer in FIG. 1, but the disclosure is not limited thereto, and auxiliary layers such as a hole injection layer (HIL), a hole transporting layer (HTL), an electron transporting layer (ETL), and an electron injection layer (EIL) may be included in the emission layer 370. The hole injection layer and the hole transport layer may be positioned on the bottom of the emission layer 370, and the electron transport layer and the electron injection layer may be positioned on the top of the emission layer 370.

A second electrode 270 may be positioned on the emission layer 370 and the bank 350. The second electrode 270 may be positioned on entire area of the substrate 110. The second electrode 270 may be a cathode, and may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li) or a transparent conductive oxide (TCO) such as ITO (Indium Tin Oxide) or IZO (Indium Zinc Oxide).

The first electrode 191, the emission layer 370, and the second electrode 270 may configure a light-emitting device ED. The first electrode 191 may be an anode that is a hole injection electrode, and the second electrode 270 may be a cathode that is an electron injection electrode. However, without being limited thereto, the anode may be exchanged with the cathode depending on a method for driving a display device.

Light may emit in case that the holes and the electrons are injected into the emission layer 370 from the first electrode 191 and the second electrode 270, and excitons that are a combination of the injected holes and the electrons fall to the ground state from the excited state.

Although not shown, an encapsulation layer may be positioned on the second electrode 270. The encapsulation layer may protect the light emitting device ED from moisture or oxygen that may be input from an outside, and may include at least one inorganic layer and at least one organic layer. For example, the encapsulation layer may have a structure in which a first inorganic encapsulation layer, an organic encapsulation layer, and a second inorganic encapsulation layer are stacked each other. However, the disclosure is not limited thereto, and the numbers of the inorganic layers and the organic layers configuring the encapsulation layer may be variable.

The display device according to an embodiment may include multiple pixels, and the respective pixels may include multiple transistors and light-emitting devices connected thereto. The structure of one transistor connected to the light-emitting device has been described, and multiple transistors may be positioned in one pixel. For example, one pixel may include two transistors and a light-emitting device connected to the two transistors. One of the transistors included in one pixel may be made of a polycrystalline transistor, and another may be made of an oxide transistor.

A method for manufacturing a display device according to an embodiment will now be described with reference to FIG. 2 to FIG. 12.

FIG. 2 to FIG. 12 are schematic cross-sectional views illustrating a method for manufacturing a display device according to an embodiment.

Figure 2:
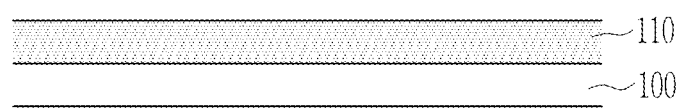
FIG. 2 to FIG. 12 are schematic cross-sectional views illustrating a method for manufacturing a display device according to an embodiment.

As shown in FIG. 2, a substrate 110 may be formed on the supporting substrate 100.

The supporting substrate 100 may be made of a rigid material. For example, the supporting substrate 100 may include glass or a metal. The substrate 110 formed on the supporting substrate 100 may be made of a flexible material. For example, the substrate 100 may include a plastic such as polyimide. The supporting substrate 100 may support the substrate 110 while elements are formed on the substrate 110.

The substrate 110 may be a single layer or a multilayer. Another layer may be positioned between the supporting substrate 100 and the substrate 110. For example, a layer for readily separating the substrate 110 from the supporting substrate 100 in a following process may be positioned between the supporting substrate 100 and the substrate 110.

Figure 3:
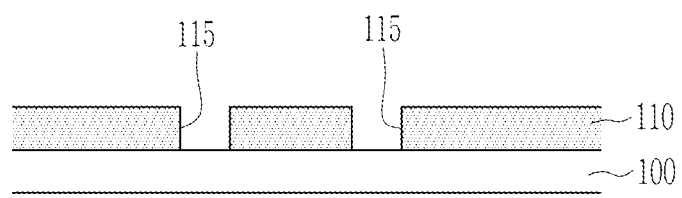

Referring to FIG. 3, an opening 115 may be formed in the substrate 110 by patterning the substrate 110. The opening 115 may be formed by a process for removing a region of the substrate 110. The opening 115 may penetrate the substrate 110. A depth of the opening 115 may correspond to a thickness of the substrate 110. Therefore, at least a part of the upper side of the supporting substrate 100 may be exposed by the opening 115. Multiple openings 115 may be formed in the substrate 110.

Figure 4:
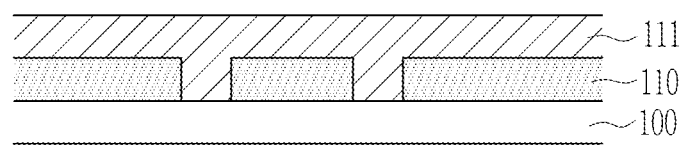

Referring to FIG. 4, a buffer layer 111 may be formed on the substrate 110 and the supporting substrate 100 by using an inorganic insulating material such as a silicon nitride ($SiN_x$), a silicon oxide ($SiO_x$), or a silicon oxynitride ($SiO_xN_y$) or an organic insulating material. The buffer layer 111 may be generally formed on the substrate 110. The buffer layer 111 may be formed in the opening 115 of the substrate 110. The buffer layer 111 may fill the opening 115 of the substrate 110, and the upper side of the buffer layer 111 may be planar.

Figure 5:
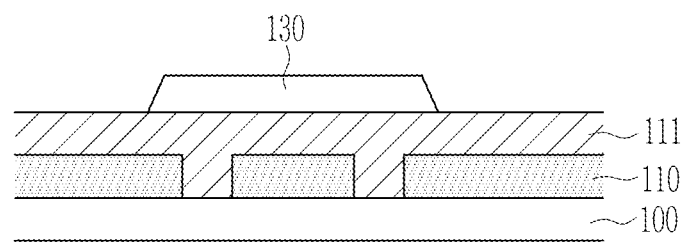

Referring to FIG. 5, a semiconductor 130 may be formed on the buffer layer 111 by using a semiconductor material such as amorphous silicon, polycrystalline silicon, or an oxide semiconductor.

The semiconductor 130 may overlap the opening 115 of the substrate 110 in a plan view. The semiconductor 130 may overlap the openings 115. For example, the semiconductor 130 may overlap the two openings 115 spaced from each other with a gap therebetween.

Figure 6:
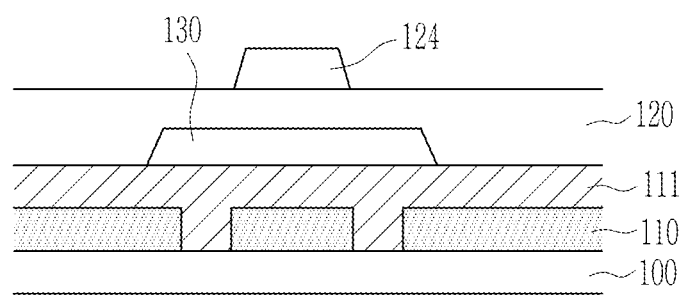

Referring to FIG. 6, a gate insulating layer 120 may be formed on the semiconductor 130 and the buffer layer 111 by using an inorganic insulating material such as a silicon nitride ($SiN_x$), a silicon oxide ($SiO_x$), or a silicon oxynitride ($SiO_xN_y$).

A gate electrode 124 may be formed on the gate insulating layer 120 by using a metal such as copper (Cu), molybdenum (Mo), aluminum (Al), silver (Ag), chromium (Cr), tantalum (Ta), or titanium (Ti), or a metal alloy thereof. Two or more metal layers may be consecutively deposited and may be simultaneously patterned to form a gate electrode 124. The gate electrode 124 may overlap the semiconductor 130 in a plan view. The gate electrode 124 may overlap a region of the semiconductor 130, and may not overlap another region thereof.

Figure 7:
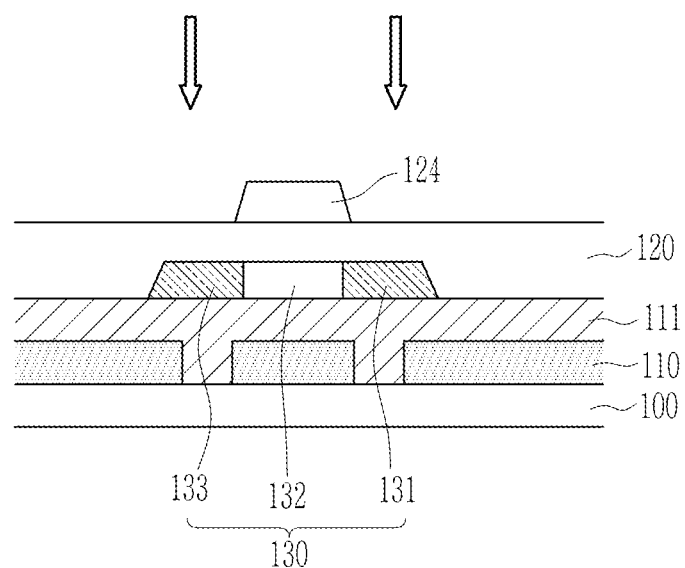

Referring to FIG. 7, a doping process or a plasma process may be performed. A material such as boron (B) may be injected on the gate insulating layer 120 by using the gate electrode 124 as a mask. A portion of the semiconductor 130 covered by the gate electrode 124 may not be doped or plasma-processed and may become a channel region 132. A portion of the semiconductor 130 that is not covered by the gate electrode 124 may be doped or plasma-processed to have a characteristic of a conductor, and may become the first region 131 and the second region 133. The first region 131 and the second region 133 of the semiconductor 130 may be positioned on respective sides of the channel region 132. For example, the channel region 132 of the semiconductor 130 may be positioned between the first region 131 and the second region 133. The first region 131 and the second region 133 of the semiconductor 130 may overlap the opening 115 of the substrate 110 in a plan view. The opening 115 of the substrate 110 may not overlap the channel region 132 of the semiconductor 130. The opening 115 of the substrate 110 may not overlap the gate electrode 124.

Figure 8:
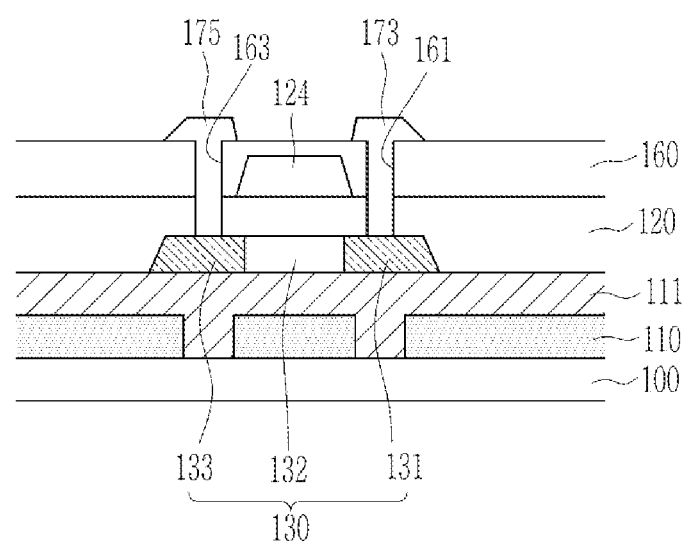

Referring to FIG. 8, an interlayer insulating layer 160 may be formed on the gate electrode 124 by using an inorganic insulating material such as a silicon nitride ($SiN_x$), a silicon oxide ($SiO_x$), or a silicon oxynitride ($SiO_xN_y$). The openings 161 and 163 may be formed by patterning the interlayer insulating layer 160 and the gate insulating layer 120 by a photo and etching process. The upper side of the first region 131 of the semiconductor 130 may be exposed by the opening 161. The upper side of the second region 133 of the semiconductor 130 may be exposed by the opening 163.

A source electrode 173 and a drain electrode 175 may be formed on the interlayer insulating layer 160 by using a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. Two or more metal layers may be consecutively deposited and may be simultaneously patterned to form a source electrode 173 and a drain electrode 175. For example, a layer including titanium, a layer including aluminum, and a layer including titanium may be sequentially formed and may be patterned to form the source electrode 173 and the drain electrode 175. The source electrode 173 may be connected to the first region 131 of the semiconductor 130 through the opening 161, and the drain electrode 175 may be connected to the second region 133 of the semiconductor 130 through the opening 163.

The openings 161 and 163 of the interlayer insulating layer 160 may overlap the opening 115 of the substrate 110 in a plan view. Therefore, the portion on which the source electrode 173 contacts the semiconductor 130 may overlap the opening 115 of the substrate 110. The portion on which the drain electrode 175 contacts the semiconductor 130 may overlap the opening 115 of the substrate 110.

Figure 9:
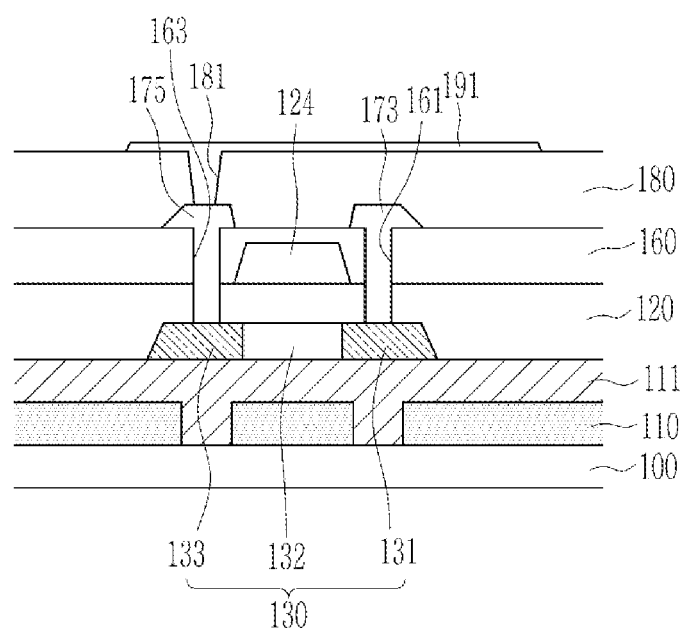

Referring to FIG. 9, the passivation layer 180 may be formed on the source electrode 173 and the drain electrode 175 by using an organic insulating material such as a general-purpose polymer such as poly(methyl methacrylate) (PMMA) or polystyrene (PS), a polymer derivative having a phenol-based group, an acryl-based polymer, an imide-based polymer, polyimide, an acryl-based polymer, and a siloxane-based polymer. An opening 181 may be formed by patterning the passivation layer 180. The upper side of the drain electrode 175 may be exposed by the opening 181.

A first electrode 191 may be formed on the passivation layer 180 by using a transparent conductive oxide or a metal. Two or more layers may be formed by continuous deposition and may be simultaneously patterned to form the first electrode 191. For example, a layer including an ITO, a layer including silver (Ag), and a layer including an ITO may be sequentially formed and may be patterned to form the first electrode 191. The first electrode 191 may be connected to the drain electrode 175 through the opening 181.

Figure 10:
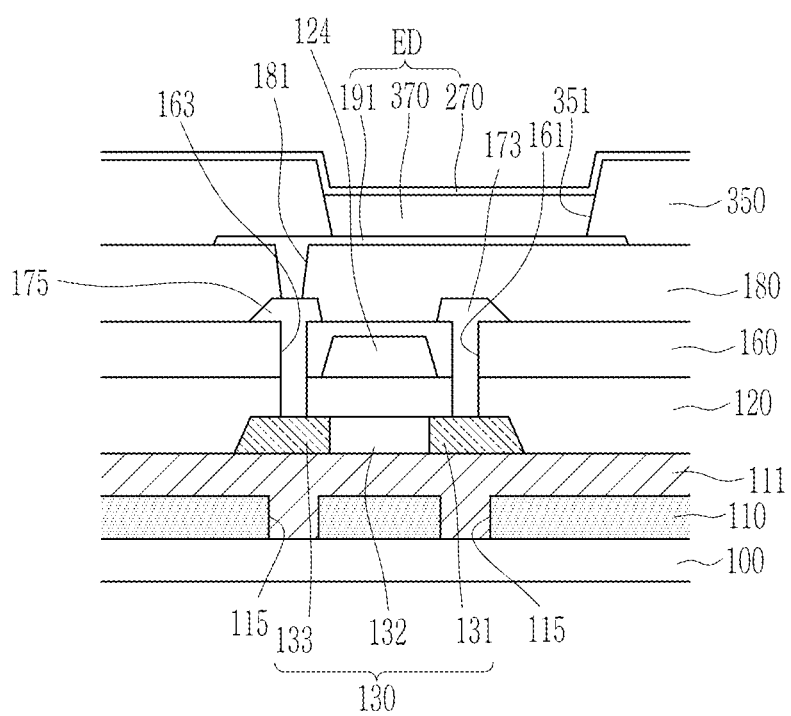

Referring to FIG. 10, a bank 350 may be formed on the first electrode 191 and the passivation layer 180 by using an organic insulating material or an inorganic insulating material. The pixel opening 351 may be formed by patterning the bank 350. The pixel opening 351 may overlap the first electrode 191 in a plan view. The pixel opening 351 may overlap a center portion of the first electrode 191, and may not overlap an edge portion of the first electrode 191.

An emission layer 370 may be formed in the pixel opening 351. The emission layer 370 is illustrated as a single layer in FIG. 10, but the disclosure is not limited thereto, and auxiliary layers such as a hole injection layer (HIL), a hole transporting layer (HTL), an electron transporting layer (ETL), and an electron injection layer (EIL) may be formed in the emission layer 370.

A second electrode 270 may be formed on the emission layer 370 and the bank 350 by using a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li) or a transparent conductive oxide (TCO) including such as an ITO (Indium Tin Oxide) or an IZO (Indium Zinc Oxide). The second electrode 270 may be positioned in an entire area of the substrate 110. The first electrode 191, the emission layer 370, and the second electrode 270 may configure a light-emitting device ED.

Although not shown, an encapsulation layer may be formed on the second electrode 270.

Figure 11:
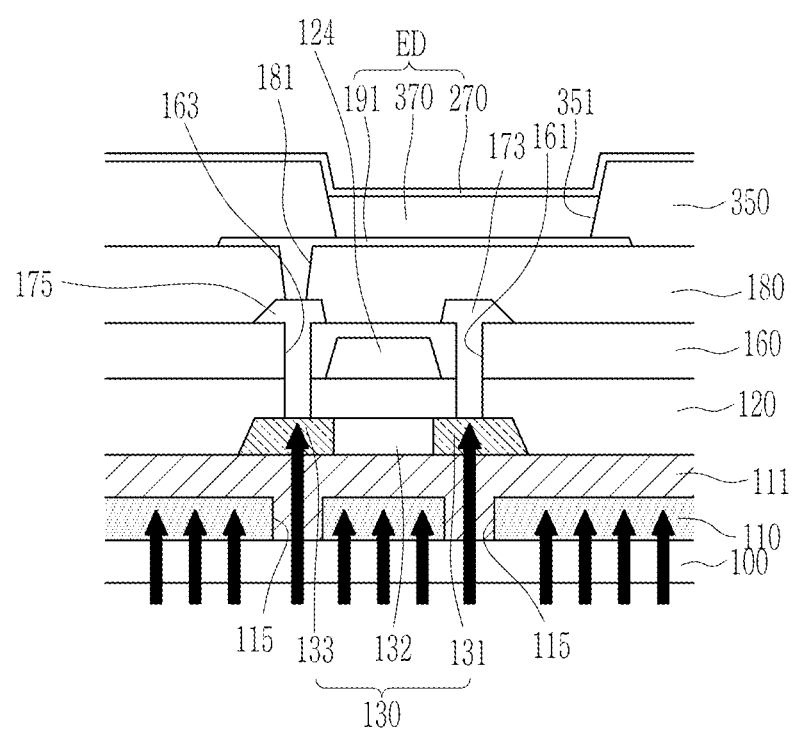

Referring to FIG. 11, laser beams may be irradiated on a rear side (or a lower side that is a side that the substrate 110 is not disposed on) of the supporting substrate 100. The supporting substrate 100 may be separated from the substrate 110 by irradiating the laser beams on the supporting substrate 100. The laser beams may be irradiated on the rear side of the supporting substrate 100. Energy density of the laser beams in the laser irradiating process may be equal to or greater than about 300 $mJ/cm^2$ and may be equal to or less than about 400 $mJ/cm^2$. In case that the energy density is less than about 300 $mJ/cm^2$, the supporting substrate 100 may not be sufficiently separated from the substrate 110. In case that the energy density is greater than about 400 $mJ/cm^2$, the substrate 110 may be damaged. However, without being limited thereto, the energy density of the laser beams may be appropriately selected by considering characteristics of the material of the substrate 110 or the supporting substrate 100 and adherence between them. A scan pitch of the laser beams in the laser irradiating process may be equal to or greater than about 15 μm and may be equal to or less than about 30 μm.

The laser beams irradiated in the laser irradiating process may pass through the supporting substrate 100 and may reach the substrate 110, but may not pass through the substrate 110. According to an embodiment, the opening 115 may be formed in the substrate 110 so the laser beams may pass through the opening 115 of the substrate 110. Therefore, the laser beams may pass through the buffer layer 111 through the opening 115 of the substrate 110 and may reach the semiconductor 130. In case that the laser beams are irradiated to the semiconductor 130, it may influence the characteristic of the semiconductor 130. For example, resistance of the portion of the semiconductor 130 to which the laser beams are irradiated may be lowered.

Figure 12:
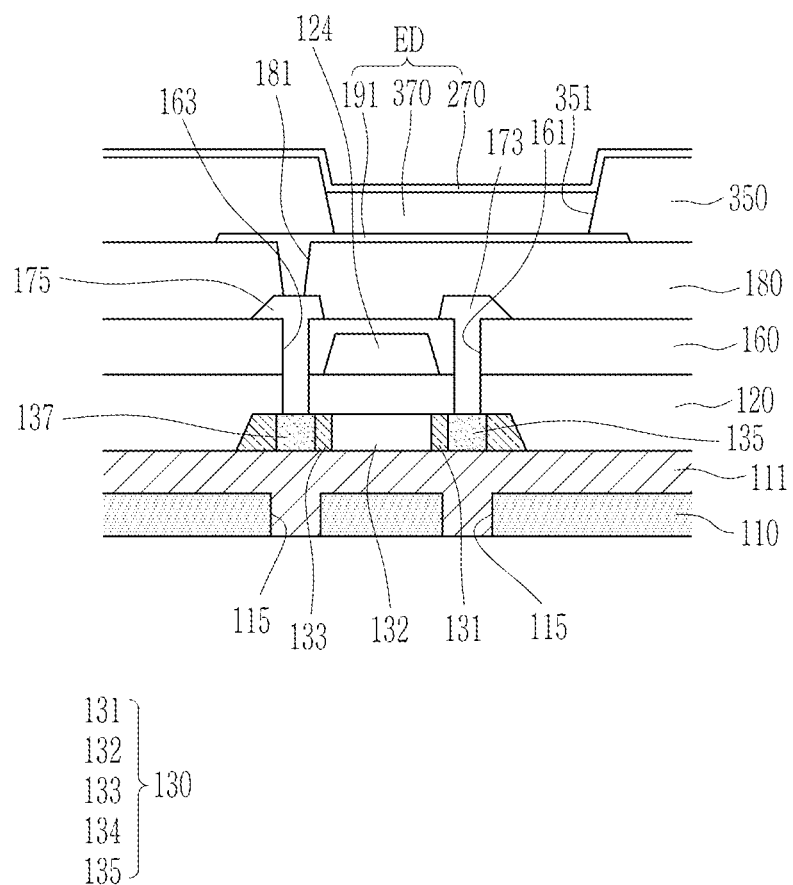

Referring to FIG. 12, the supporting substrate 100 may be removed by the laser irradiating process, and the portion of the semiconductor 130 to which the laser beams are irradiated may become the first contact region 135 and the second contact region 137. The portion to which the laser beams are irradiated may become the first contact region 135 in the first region 131 of the semiconductor 130. The portion to which the laser beams are irradiated may become the second contact region 137 in the second region 133 of the semiconductor 130.

The first region 131 may be positioned on a side of the first contact region 135. For example, the first contact region 135 may be surrounded by the first region 131. However, the disclosure is not limited thereto, and the position of the first contact region 135 may be changed. For example, the first contact region 135 may be positioned between the channel region 132 and the first region 131. The second region 133 may be positioned on a side of the second contact region 137. For example, the second contact region 137 may be surrounded by the second region 133. However, the disclosure is not limited thereto, and the position of the second contact region 137 may be changed. For example, the second contact region 137 may be positioned between the channel region 132 and the second region 133.

The first contact region 135 may overlap the opening 115 in a direction that is perpendicular to the upper side of the substrate 110. The thickness of the first contact region 135 may be similar to the thickness of the first region 131. For example, the thickness of the first contact region 135 and the thickness of the first region 131 may be substantially the same. However, without being limited thereto, the thickness of the first contact region 135 may be less than the thickness of the first region 131. The width of the first contact region 135 may correspond to the width of the portion of the opening 115 overlapping the first contact region 135. For example, the width of the first contact region 135 and the width of the portion of the opening 115 overlapping the first contact region 135 may be substantially the same. However, without being limited thereto, the width of the first contact region 135 may be greater or less than the width of the portion of the opening 115 overlapping the first contact region 135. The thickness and the width of the first contact region 135 are variable according to the energy density and the irradiation time of laser beams.

The second contact region 137 may overlap the opening 115 in the direction that is perpendicular to the upper side of the substrate 110. The thickness of the second contact region 137 may be similar to the thickness of the second region 133. For example, the thickness of the second contact region 137 and the thickness of the second region 133 may be substantially the same. However, without being limited thereto, the thickness of the second contact region 137 may be less than the thickness of the second region 133. The width of the second contact region 137 may correspond to the width of the portion of the opening 115 overlapping the second contact region 137. For example, the width of the second contact region 137 and the width of the portion of the opening 115 overlapping the second contact region 137 may be substantially the same. However, without being limited thereto, the width of the second contact region 137 may be greater or less than the width of the portion of the opening 115 overlapping the second contact region 137. The thickness and the width of the second contact region 137 are variable according to the energy density and the irradiation time of laser beams.

The first contact region 135 and the second contact region 137 may have a conductive characteristic that corresponds to the conductor similar to the first region 131 and the second region 133. The conductive characteristic of the first contact region 135 and the second contact region 137 may be different from the conductive characteristic of the first region 131 and the second region 133. For example, resistances of the first contact region 135 and the second contact region 137 may be lower than resistances of the first region 131 and the second region 133. The first contact region 135 may contact the source electrode 173, and the second contact region 137 may contact the drain electrode 175. By lowering the resistance of the portion of the semiconductor 130 on which the source electrode 173 and the drain electrode 175 contact as described above, the characteristic of the transistor TFT may be improved.

According to an embodiment, the supporting substrate 100 may be separated from the substrate 110 by the laser irradiating process, and the contact characteristic between the semiconductor and the source/drain electrode may be improved. By forming the opening in the region of the substrate, the characteristics of the elements included in the display device may be improved in the process for separating the supporting substrate 100 from the substrate 110.

A laser process used by a method for manufacturing a display device according to an embodiment will now be described with reference to FIG. 13 and FIG. 14.

Figure 13:
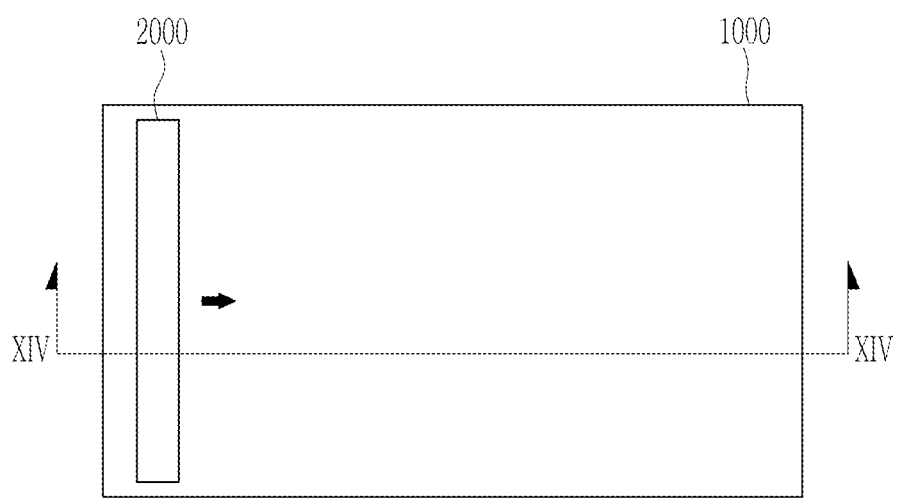
FIG. 13 is a top plan view illustrating a position relationship between a display device and laser equipment in a laser process used to a method for manufacturing a display device according to an embodiment.
Figure 14:
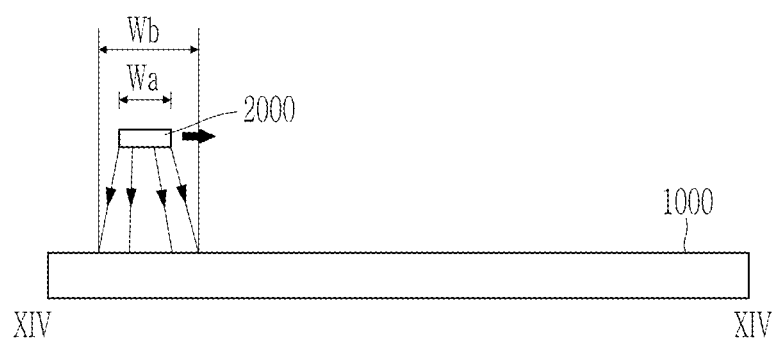
FIG. 14 shows a schematic cross-sectional view with respect to line XIV-XIV of FIG. 13.

FIG. 13 is a top plan view illustrating a position relationship between a display device and laser equipment in a laser process used in a method for manufacturing a display device according to an embodiment, and FIG. 14 shows a schematic cross-sectional view with respect to line XIV-XIV of FIG. 13.

As shown in FIG. 13 and FIG. 14, the laser equipment 2000 may be positioned to overlap an edge of the display device 1000 in a plan view. The laser equipment 2000 may be positioned on the rear side (or lower side) of the display device 1000. Hence, the laser beams irradiated by the laser equipment 2000 may reach the rear side of the display device 1000. The supporting substrate 100 may be positioned on the rear side of the display device 1000, and the laser beams may reach the supporting substrate 100.

The energy density of the laser beams of the laser equipment 2000 used in the laser irradiating process may be equal to or greater than about 300 mJ/cm$^2$ and may be equal to or less than about 400 mJ/cm$^2$. A width Wa of the laser equipment 2000 may be about 480 μm, and a width Wb of the laser beams irradiated by the laser equipment 2000 and transmitted to the display device 1000 may be about 680 μm. The laser beams may be transmitted to the supporting substrate 100 that is distant from the display device 1000 by about 100 μm. The energy of the laser beams irradiated to the portion of the display device 1000 overlapping the laser equipment 2000 may be greater than the energy of the laser beams transmitted to a nearby portion thereof.

The laser equipment 2000 may irradiate the laser beams while moving toward an edge of the display device 1000 from another edge. The laser equipment 2000 may irradiate the laser beams for a predetermined (or selectable) time at a predetermined (or selectable) point, moves by a predetermined (or selectable) distance, and irradiate the laser beams again. The distance by which the laser equipment 2000 moves once may be referred to as a scan pitch, and may be equal to or greater than about 15 μm and may be equal to or less than about 30 μm. As the scan pitch is sufficiently less than the width of the laser equipment 2000, the laser beams may be uniformly irradiated to the display device 1000.

A display device according to an embodiment will now be compared to a display device according to a reference embodiment with reference to FIG. 15 to FIG. 20.

Figure 15:
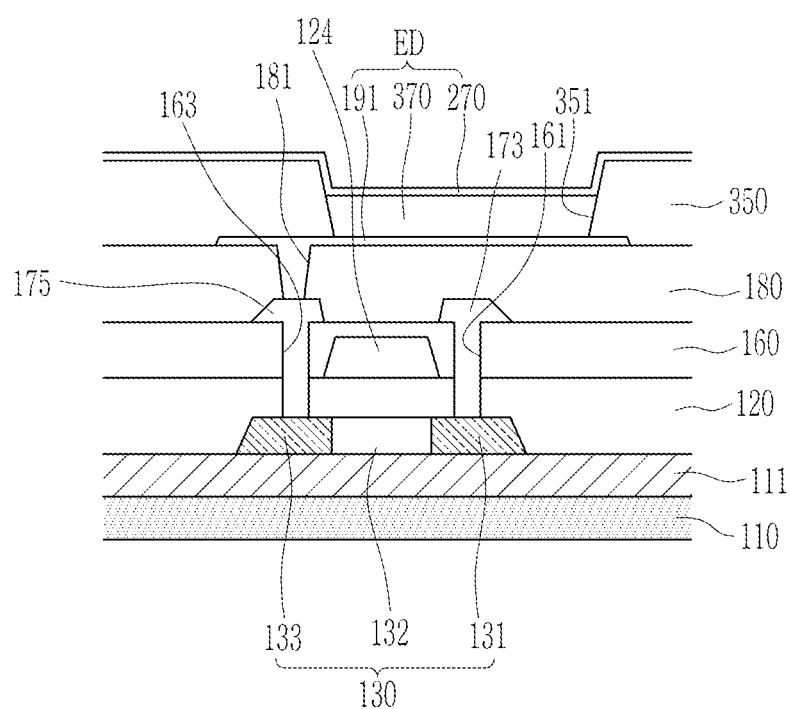
FIG. 15 shows a schematic cross-sectional view of a display device according to a reference embodiment.
Figure 16:
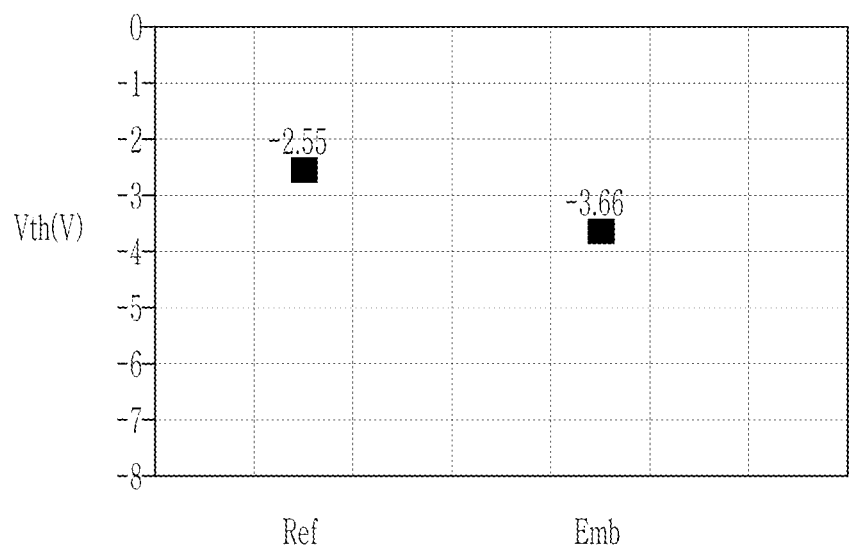
FIG. 16 shows a graph of threshold voltages of a transistor of a display device according to an embodiment and a display device according to a reference embodiment.
Figure 17:
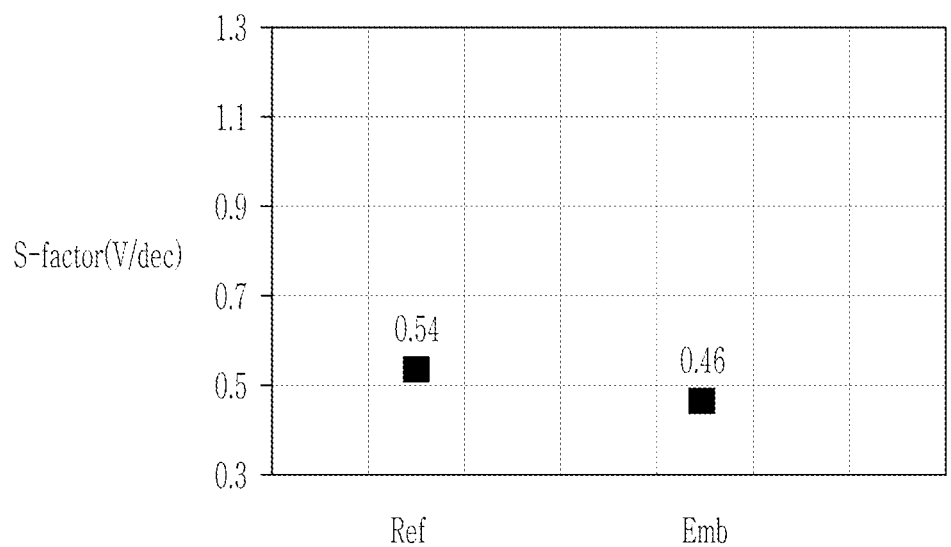
FIG. 17 shows a graph of an S-factor of a transistor of a display device according to an embodiment and a display device according to a reference embodiment.
Figure 18:
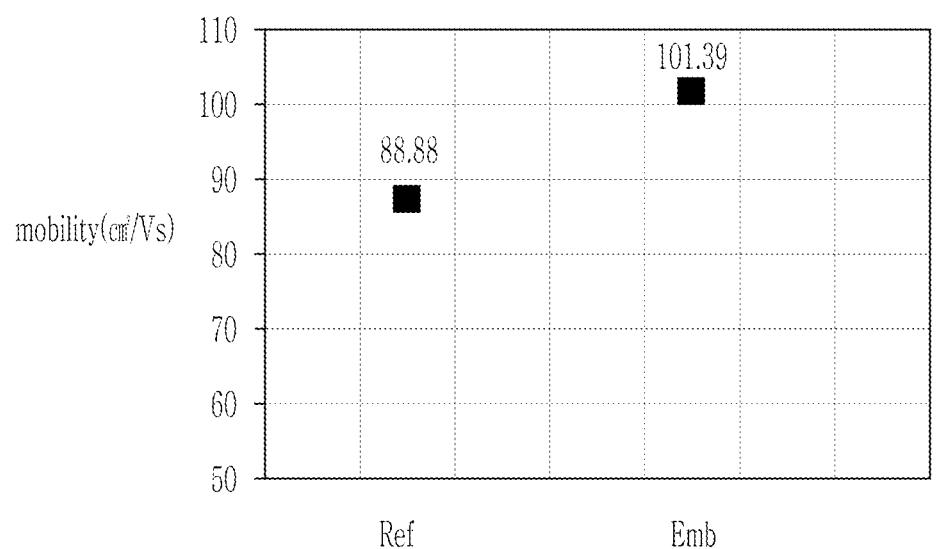
FIG. 18 shows a graph of mobility of a transistor of a display device according to an embodiment and a display device according to a reference embodiment.
Figure 19:
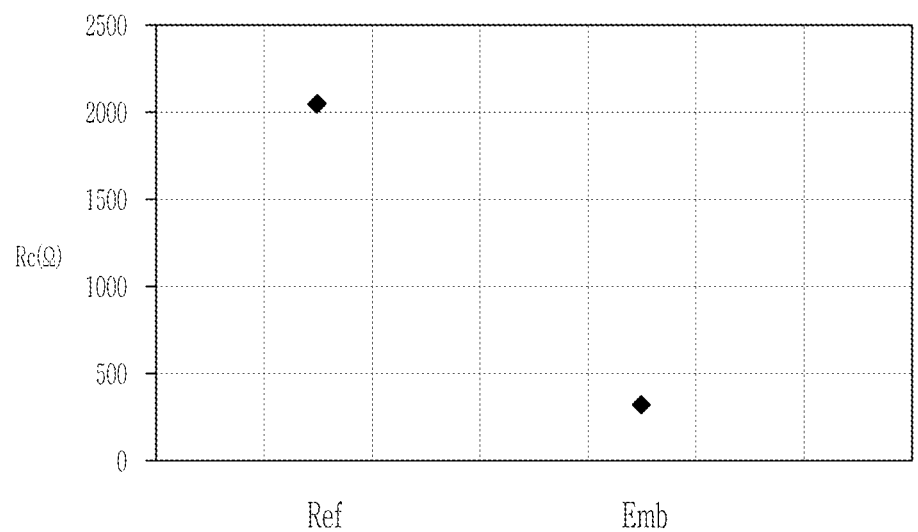
FIG. 19 shows a graph of contact resistance of a transistor of a display device according to an embodiment and a display device according to a reference embodiment.
Figure 20:
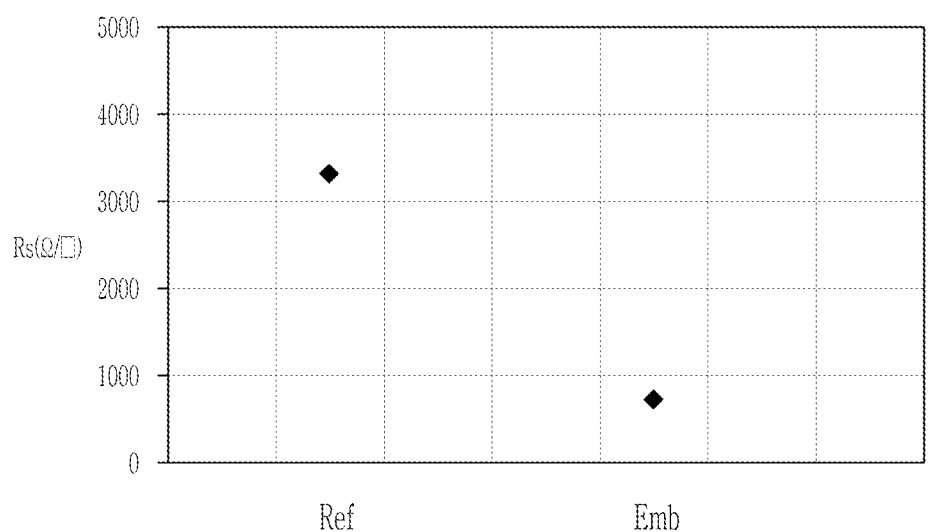
FIG. 20 shows a graph of sheet resistance of a transistor of a display device according to an embodiment and a display device according to a reference embodiment.

FIG. 15 shows a schematic cross-sectional view of a display device according to a reference embodiment. FIG. 16 shows a graph of threshold voltages of a transistor of a display device according to an embodiment and a display device according to a reference embodiment, FIG. 17 shows a graph of an S-factor of a transistor of a display device according to an embodiment and a display device according to a reference embodiment, FIG. 18 shows a graph of mobility of a transistor of a display device according to an embodiment and a display device according to a reference embodiment, FIG. 19 shows a graph of contact resistance of a transistor of a display device according to an embodiment and a display device according to a reference embodiment, and FIG. 20 shows a graph of sheet resistance of a transistor of a display device according to an embodiment and a display device according to a reference embodiment.

As shown in FIG. 15, the display device according to a reference embodiment may include a substrate 110, a transistor TFT positioned on the substrate 110, and a light-emitting device ED connected to the transistor TFT.

The opening may be formed in the substrate in the display device of the embodiment of FIG. 1, the opening may be not formed in the substrate 110 in the display device according to the reference embodiment. To manufacture the display device according to the reference embodiment, the substrate 110 may be formed on the supporting substrate, the transistor TFT and the light-emitting device ED may be formed on the substrate 110, and the supporting substrate may be removed from the substrate 110. A process for irradiating laser beams to the rear side of the display device may be performed to remove the supporting substrate, and as no opening is formed in the substrate 110, the laser beams may not pass through the substrate 110. For example, the laser beams irradiated in the laser irradiating process may not reach the semiconductor 130.

In the display device according to the reference embodiment, a heat treatment process for applying heat in a chamber may be performed to improve the contact characteristic between the semiconductor 130 and the source and drain electrodes 173 and 175. The heat treatment process may be progressed at the temperature in a range of about 360 degrees to about 370 degrees for about 15 minutes to about 30 minutes. The heat supplied into the chamber may be generally transmitted to the display device, and may be not selectively applied to the contact portion between the semiconductor 130 and the source and drain electrodes 173 and 175.

As shown in FIG. 16, a threshold voltage of the transistor in the display device Ref according to the reference embodiment may be about −2.55 V. The threshold voltage of the transistor in the display device Emb according to the embodiment of FIG. 1 may be about −3.66 V. The display device may be normally operable in case that the threshold voltage of the transistor is equal to or greater than about −3.9 V and equal to or less than about −2.55 V Hence, the display device Ref according to the reference embodiment and the display device Emb according to the embodiment of FIG. 1 may be in a normal operation range.

As shown in FIG. 17, an S-factor of the display device Ref according to the reference embodiment may be about 0.54 V/dec. The S-factor of the display device Emb according to the embodiment of FIG. 1 may be about 0.46 V/dec. The S-factor indicates a current-voltage characteristic of the transistor, and signifies a size of a gate voltage for increasing a drain current ten times in case that the gate voltage that is equal to or less than the threshold voltage is applied. The smaller the S-factor is, the faster the switching rate of the transistor between a turn-on state and a turn-off state is. For example, the smaller the S-factor is, the faster the driving rate of the transistor may be. The S-factor of the display device Emb according to the embodiment of FIG. 1 is less than that of the display device Ref according to the reference embodiment, and the driving rate of the transistor Emb according to the embodiment of FIG. 1 may be faster.

As shown in FIG. 18, a mobility of the display device Ref according to the reference embodiment may be about 88.88 $cm^2/Vs$. The mobility of the display device Emb according to the embodiment of FIG. 1 may be about 101.39 $cm^2/Vs$. It is found that the moving rate of carriers of the transistor in the display device Emb according to the embodiment of FIG. 1 is higher than that of the display device Ref according to the reference embodiment.

As shown in FIG. 19, a contact resistance of the display device Ref according to the reference embodiment may be equal to or greater than about 2000Ω. The contact resistance of the display device Emb according to the embodiment of FIG. 1 may be equal to or less than about 400Ω. It is found that the contact resistance between the semiconductor of the transistor and the source/drain electrodes in the display device Emb according to the embodiment of FIG. 1 is lower than that of the display device Ref according to the reference embodiment.

As shown in FIG. 20, a sheet resistance of the display device Ref according to the reference embodiment may be equal to or greater than about 3000Ω/☐ (or ohm/square). The sheet resistance of the display device Emb according to the embodiment of FIG. 1 may be equal to or less than about 800Ω/☐ (or ohm/square). It is found that the sheet resistance of the transistor in the display device Emb according to the embodiment of FIG. 1 is lower than that of the display device Ref according to the reference embodiment.

To improve the contact characteristic between the semiconductor and the source/drain electrodes, the entire display device of the reference embodiment may be heat-treated, and a portion of the display device according to the embodiment of FIG. 1 may be irradiated by laser beams. As a result, as described with reference to FIG. 16 to FIG. 20, the characteristic of the transistor of the display device according to the embodiment of FIG. 1 may be improved. For example, it is found that the transistor of the display device according to the embodiment of FIG. 1 has a faster driving rate, higher mobility, and lower resistance.

The characteristic of the transistor may be simultaneously improved by using the laser irradiating process for separating the supporting substrate, thereby simplifying the process and reducing the processing time.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:
   a substrate including an opening;
   a buffer layer disposed on the substrate;
   a semiconductor disposed on the buffer layer;
   a gate electrode overlapping at least a portion of the semiconductor in a plan view;
   a source electrode and a drain electrode electrically connected to the semiconductor; and
   a light-emitting device electrically connected to the drain electrode,
   wherein the opening of the substrate overlaps another portion of the semiconductor in a plan view.

2. The display device of claim 1, wherein the semiconductor includes:
   a channel region overlapping the gate electrode in a plan view;
   a first region disposed on a side of the channel region;
   a second region disposed on another side of the channel region;
   a first contact region disposed in the first region; and
   a second contact region disposed in the second region.

3. The display device of claim 2, wherein
   the opening of the substrate comprises a first opening and a second opening,
   the first opening of the substrate overlaps the first contact region in a plan view, and
   the second opening of the substrate overlaps the second contact region in a plan view.

4. The display device of claim 3, wherein
   the source electrode electrically contacts an upper surface of the first contact region, and
   the drain electrode electrically contacts an upper surface of the second contact region.

5. The display device of claim 3, wherein
   a width of the first opening of the substrate and a width of the first contact region in a cross-sectional view are same, and
   a width of the second opening of the substrate and a width of the second contact region in a cross-sectional view are same.

6. The display device of claim 3, wherein
   a resistance of the first contact region is lower than a resistance of the first region, and
   a resistance of the second contact region is lower than a resistance of the second region.

7. The display device of claim 1, further comprising:
   an interlayer insulating layer disposed between the semiconductor and the source electrode and between the semiconductor and the drain electrode, wherein
   the interlayer insulating layer includes:
      a first opening overlapping the semiconductor and the source electrode in a plan view; and
      a second opening overlapping the semiconductor and the drain electrode in a plan view,
   the source electrode is electrically connected to the semiconductor through the first opening of the interlayer insulating layer, and
   the drain electrode is electrically connected to the semiconductor through the second opening of the interlayer insulating layer.

8. The display device of claim 7, wherein the first opening and the second opening of the interlayer insulating layer overlap the opening of the substrate in a plan view.

9. The display device of claim 1, wherein the substrate includes a flexible material.

10. The display device of claim 9, wherein the buffer layer fills the opening of the substrate.

11. A method for manufacturing a display device, comprising:
    forming a substrate on a supporting substrate;
    forming an opening in the substrate by patterning the substrate;
    forming a buffer layer on the substrate;
    forming a semiconductor overlapping the opening of the substrate in a plan view on the buffer layer;
    forming a gate electrode overlapping the semiconductor in a plan view;
    forming a source electrode and a drain electrode electrically connected to the semiconductor;
    forming a light-emitting device electrically connected to the drain electrode; and
    separating the supporting substrate from the substrate by irradiating laser beams to a lower surface of the supporting substrate.

12. The method of claim 11, wherein the semiconductor includes:
    a channel region overlapping the gate electrode in a plan view;
    a first region disposed on a side of the channel region,
    a second region disposed on another side of the channel region;
    a first contact region disposed in the first region; and
    a second contact region disposed in the second region.

13. The method of claim 12, wherein
    the opening of the substrate comprises a first opening and a second opening,
    the first opening of the substrate overlaps the first contact region in a plan view,
    the second opening of the substrate overlaps the second contact region in a plan view, and
    the laser beams irradiated in the irradiating of the laser beams pass through the first opening and the second opening of the substrate and reach the first contact region and the second contact region.

14. The method of claim 13, wherein
    the source electrode electrically contacts an upper surface of the first contact region, and
    the drain electrode electrically contacts an upper surface of the second contact region.

15. The method of claim 13, wherein
    a width of the first opening of the substrate and a width of the first contact region in a cross-sectional view are same, and
    a width of the second opening of the substrate and a width of the second contact region in a cross-sectional view are same.

16. The method of claim 13, wherein
    a resistance of the first contact region is lower than a resistance of the first region, and
    a resistance of the second contact region is lower than a resistance of the second region.

17. The method of claim 11, further comprising:
    after the forming of the gate electrode,
    forming an interlayer insulating layer on the gate electrode; and
    forming a first opening and a second opening on the interlayer insulating layer, wherein
    the source electrode and the drain electrode are disposed on the interlayer insulating layer,
    the first opening of the interlayer insulating layer overlaps the semiconductor and the source electrode in a plan view, the second opening of the interlayer insulating layer overlaps the semiconductor and the drain electrode in a plan view, the source electrode is electrically connected to the semiconductor through the first opening of the interlayer insulating layer, and the drain electrode is electrically connected to the semiconductor through the second opening of the interlayer insulating layer.

18. The method of claim 17, wherein the first opening and the second opening of the interlayer insulating layer overlap the opening of the substrate in a plan view.

19. The method of claim 11, wherein
the supporting substrate includes a rigid material, and
the substrate includes a flexible material.

20. The method of claim 19, wherein the forming of the buffer layer includes filling the buffer layer in the opening of the substrate.

\* \* \* \* \*